US006448100B1

(12) United States Patent
Schulte et al.

(10) Patent No.: US 6,448,100 B1
(45) Date of Patent: Sep. 10, 2002

(54) METHOD FOR FABRICATING SELF-ALIGNED FIELD EMITTER TIPS

(75) Inventors: Donald W. Schulte; Terry E. McMahon, both of Corvallis, OR (US)

(73) Assignee: Hewlett-Packard Compnay, Palo Alto, CA (US)

( * ) Notice: Subject to any disclaimer, the term of this patent is extended or adjusted under 35 U.S.C. 154(b) by 0 days.

(21) Appl. No.: 09/880,159

(22) Filed: Jun. 12, 2001

(51) Int. Cl.[7] ................................................ H01L 21/00

(52) U.S. Cl. ........................... 438/20; 438/700; 438/28; 438/34

(58) Field of Search ........................ 438/20, 24; 445/24

(56) References Cited

U.S. PATENT DOCUMENTS

| | | | | | |
|---|---|---|---|---|---|
| 5,090,932 | A | | 2/1992 | Dieumegard et al. | 445/24 |
| 5,557,596 | A | | 9/1996 | Gibson et al. | 369/101 |
| 5,587,623 | A | * | 12/1996 | Jones | 313/497 |
| 6,008,576 | A | | 12/1999 | Nakatani et al. | 313/495 |
| 6,010,918 | A | * | 1/2000 | Marino et al. | 438/20 |
| 6,074,264 | A | * | 7/2000 | Hattori | 445/24 |
| 6,096,570 | A | * | 8/2000 | Hattori | 438/20 |
| 6,137,212 | A | | 10/2000 | Liu et al. | 313/308 |
| 6,139,760 | A | * | 10/2000 | Shim et al. | 216/24 |
| 6,297,067 | B1 | * | 10/2001 | Hattori | 438/20 |

* cited by examiner

*Primary Examiner*—David Nelms
*Assistant Examiner*—Thao P. Le

(57) ABSTRACT

An efficient and economical method for fabricating field emitter tips within a layered substrate. The layered substrate is patterned using standard photolithographic techniques and etched to form a rectangular or cylindrical column on top of the substrate composed of conductive and non-conductive layers. The layered substrate is then exposed to an anisotropic etching medium which removes the column to produce a well through the conductive and non-conductive layers and which produces a conical or pyramid-shaped field emitter tip within the silicon substrate directly below the well. Finally, a pull-back etch is used to remove dielectric material from the walls of the well. In an optional step, a thin metal coating may be sputtered onto the surface of the silicon-based field emitter tip.

18 Claims, 7 Drawing Sheets

METHOD FOR FABRICATING SELF-ALIGNED FIELD EMITTER TIPS

TECHNICAL FIELD

The present invention relates to microscopic field emitter tips manufactured by microchip fabrication techniques in dense field emitter tip arrays and, in particular, to a method for creating a field emitter tip within a substrate layered with alternating non-conductive and conductive layers using a single photolithography step followed by a number of different etching steps.

BACKGROUND OF THE INVENTION

The present invention relates to design and manufacture of silicon-based field emitter tips. A brief discussion of field emission and the principles of design and operation of field emitter tips is therefore first provided in the following paragraphs, with reference to FIG. 1.

When a wire, filament, or rod of a metallic or semiconductor material is heated, electrons of the material may gain sufficient thermal energy to escape from the material into a vacuum surrounding the material. The electrons acquire sufficient thermal energy to overcome a potential energy barrier that physically constrains the electrons to quantum states localized within the material. The potential energy barrier that constrains electrons to a material can be significantly reduced by applying an electric field to the material. When the applied electric field is relatively strong, electrons may escape from the material by quantum mechanical tunneling through a lowered potential energy barrier. The greater the magnitude of the electrical field applied to the wire, filament, or rod, the greater the current density of emitted electrons perpendicular to the wire, filament, or rod. The magnitude of the electrical field is inversely related to the radius of curvature of the wire, filament, or rod.

FIG. 1 illustrates principles of design and operation of a silicon-based field emitter tip. The field emitter tip 102 rises to a very sharp point 104 from a silicon-substrate cathode 106, or electron source. A localized electric field is applied in the vicinity of the tip by a first anode 108, or electron sink, having a disk-shaped aperture 110 above and around the point 104 of the field emitter tip 102. A second cathode layer 112 is located above the first anode 108, also with a disk-shaped aperture 114 aligned directly above the disk-shaped aperture 110 of the first anode layer 108. This second cathode layer 112 acts as a lens, applying a repulsive electronic field to focus the emitted electrons into a narrow beam. The emitted electrons are accelerated towards a target anode 118, impacting in a small region 120 of the target anode defined by the direction and width of the emitted electron beam 116. Although FIG. 1 illustrates a single field emitter tip, silicon-based field emitter tips are commonly micro-manufactured by microchip fabrication techniques as regular arrays, or grids, of field emitter tips.

Currently available methods for fabricating arrays of field emitter tips require either various selective silicon oxidation techniques or complex metal deposition and lift-off processes. Currently available methods require precise alignment and sequential masking deposition steps. Designers and manufacturers of microfield emitter tips arrays have recognized the need for a more simple microfabrication methodology for constructing silicon-based field emitter tips, particularly for fabricating silicon-based emitter tips on a semiconductor surface above microelectronic devices such as a field-effect transistors or diodes.

SUMMARY OF THE INVENTION

One embodiment of the present invention is a method for fabricating a silicon-based field emitter tip on a substrate that may already contain microelectronic devices. The silicon substrate is first layered with alternating dielectric and metallic layers by standard microchip fabrication techniques. A photoresist layer is then added, and is photolithographically patterned to produce a rectangular or annular groove in the photoresist. The layered substrate is then exposed to an anisotropic etch medium to create a tube-like slot through the dielectric and metallic layers, producing a layered, rectangular or cylindrical column or pinnacle on the surface of the substrate. The layered substrate is then exposed to an isotropic etch medium that creates a conical field emitter tip within the silicon substrate below the tube-like slot etched through the dielectric and metallic layers, and removing the rectangular or cylindrical column to leave a rectangular or cylindrical well through the dielectric and metallic layers. Finally, a third etching medium is used to slightly pull back the dielectric layers from the walls of the aperture. In an optional step, a thin metallic coating can be deposited by a sputter deposition technique onto the surface of the conical silicon field emitter tip.

A second embodiment of the present invention is similar to the first, but uses an anisotropic silicon etch to form the emitter tip. In this embodiment, the silicon substrate is first layered with alternating dielectric and metallic layers by standard microchip fabrication techniques. A photoresist layer is then added, and is photolithographically patterned to produce a rectangular or annular groove in the photoresist. The layered substrate is then exposed to an anisotropic etch medium to create a tube-like slot through the dielectric and metallic layers, producing a layered, rectangular or cylindrical column or pinnacle on the surface of the substrate. The layered substrate is then exposed to an anisotropic etch medium, such as potassium hydroxide, that creates a pyramid shaped filed emitter tip within the silicon substrate below the tube-like slot etched through the dielectric and metallic layers, and removing the rectangular or cylindrical column to leave a rectangular or cylindrical well through the dielectric and metallic layers. Finally, a third etching medium is used to slightly pull back the dielectric layers from the walls of the aperture. In an optional step, a thin metallic coating can be deposited by a sputter deposition technique onto the surface of the silicon field emitter tip.

DETAILED DESCRIPTION OF THE INVENTION

Figure 4:
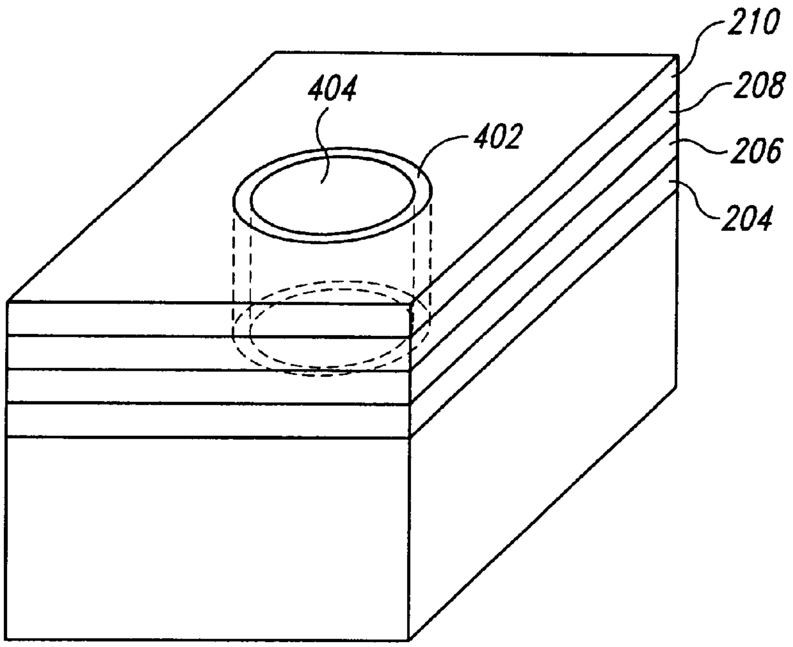
FIG. 4 shows the layered silicon substrate following an anisotropic etching step.
Figure 5:
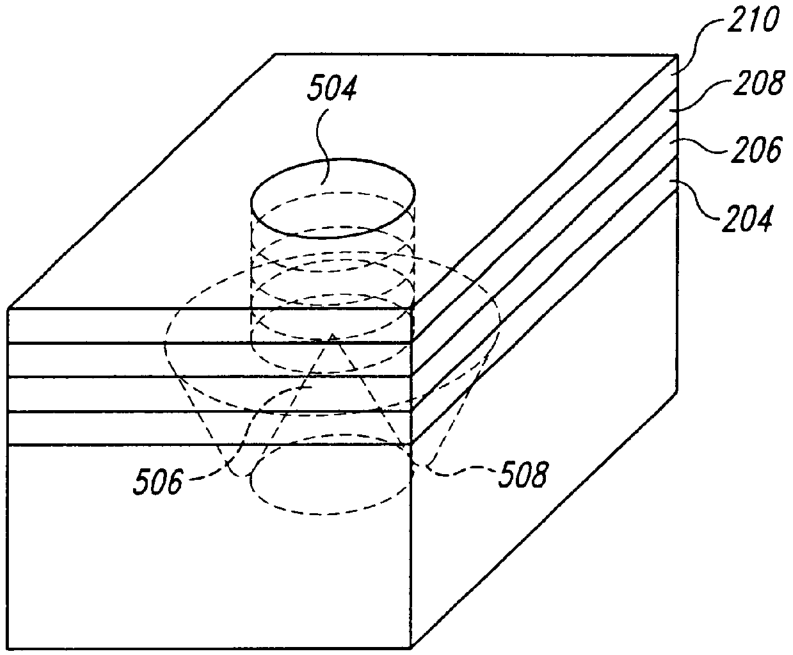
FIG. 5 shows the layered silicon substrate following a second isotropic etch step.
Figure 6:
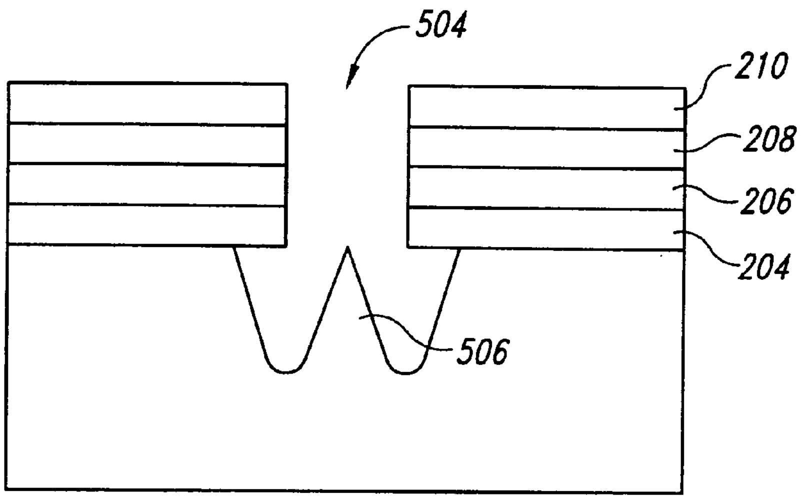
FIG. 6 shows a cross-sectional view of a portion of the layered silicon substrate following the second etching step.
Figure 7:
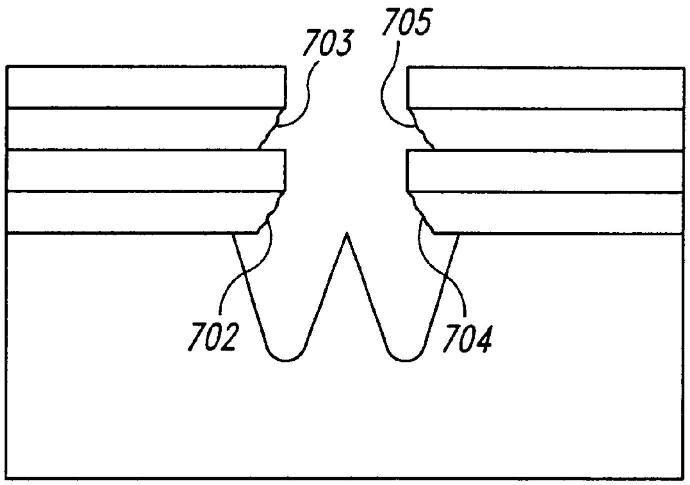
FIG. 7 shows the layered silicon substrate following a third etch, or pull-back, step.
Figure 8:
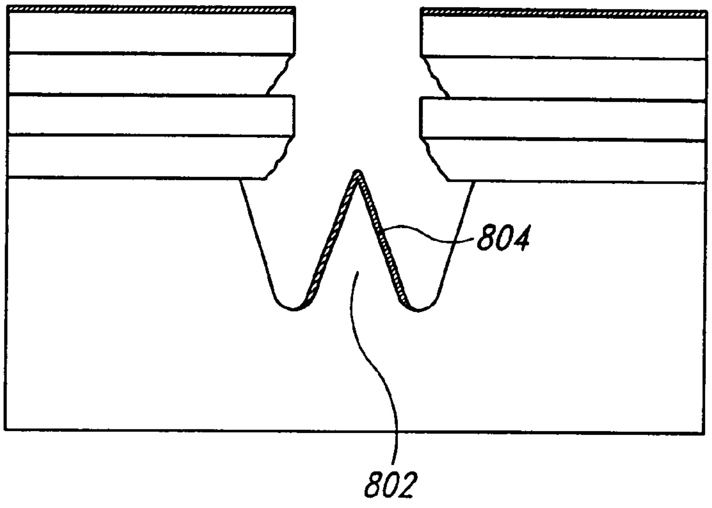
FIG. 8 shows a field emitter tip following sputter deposition of a metal onto the surface of the field emitter tip.

One embodiment of the present invention is described below with reference to FIGS. 2–8. FIGS. 2–5 are perspective views of a rectangular portion of a layered silicon substrate in which a single silicon-based field emitter tip is fabricated using the techniques that represent one embodiment of the present invention. FIGS. 6–8 are cross-sectional views of the same portion of the layered silicon substrate. The methods illustrated in FIGS. 2–8 can be applied to create arrays of field emitter tips of many different sizes, containing various densities of field emitter tips. These figures are not intended to represent specific dimensions and shapes of the layers and field emitter tips that are fabricated according to the present invention. Instead, these figures are intended to illustrate the fabrication steps described in the text. The sizes and shapes of fabricated field emitter tips are determined by the design of photolithographic masks, the chemical composition of various etching solutions, the intensity of plasma ion beams used during an anisotropic etch, and the time to which the silicon substrate is exposed to dielectric and metallic deposition media, anisotropic etching medium, and anistropic etching solutions.

Figure 1:
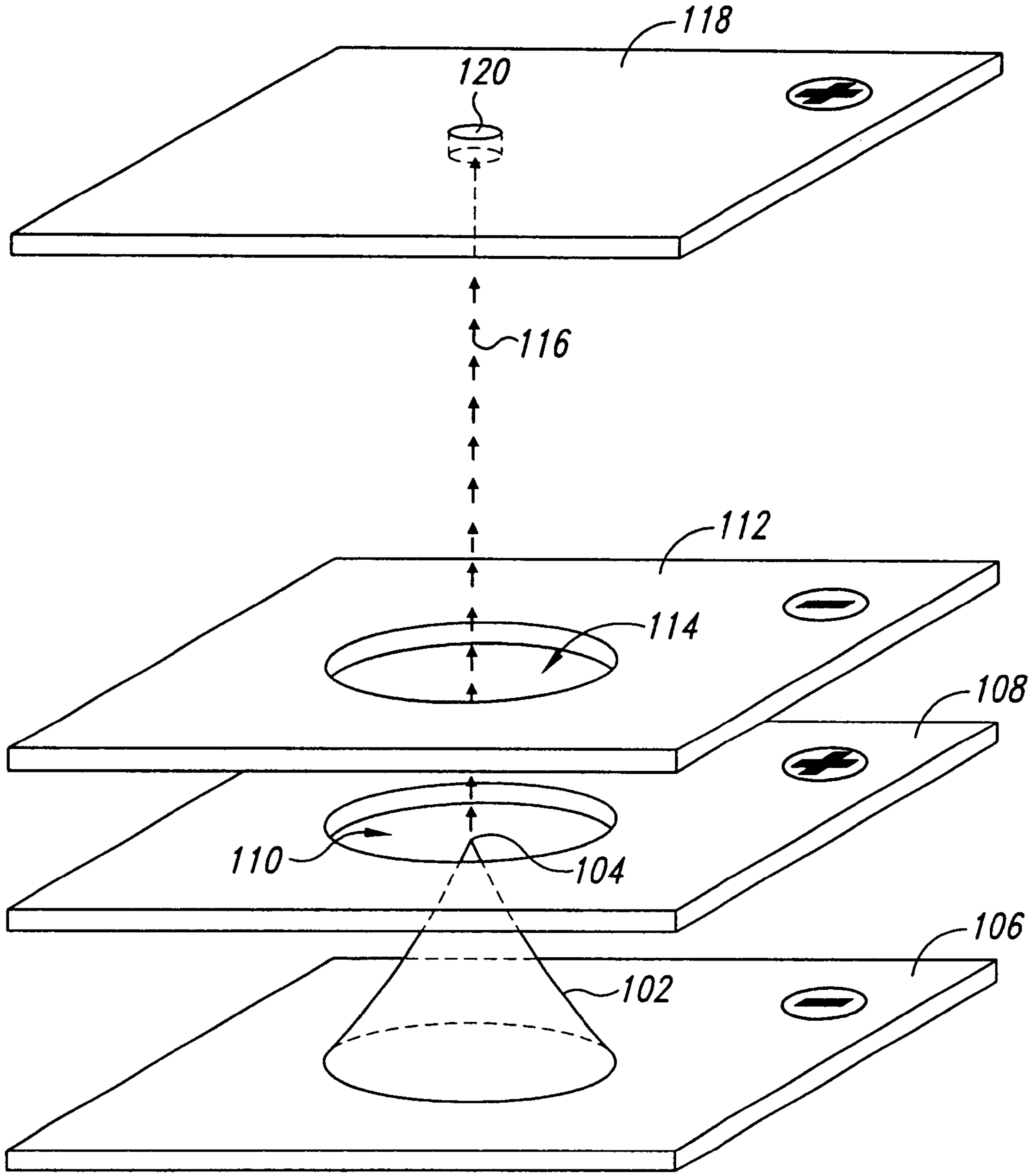
FIG. 1 illustrates principles of design and operation of a silicon-based field emitter tip.
Figure 2:
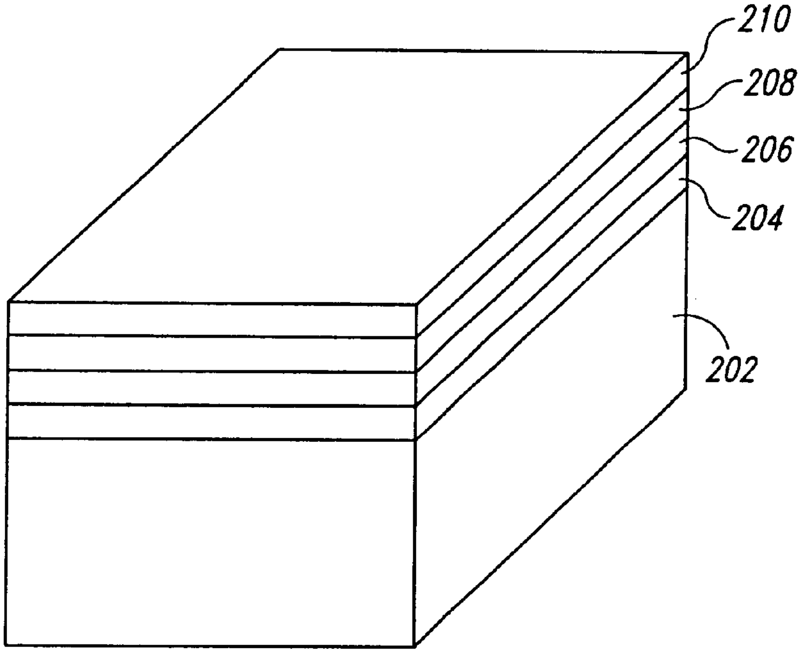
FIG. 2 shows a rectangular portion of a silicon substrate layered with dielectric and metallic layers.
Figure 3:
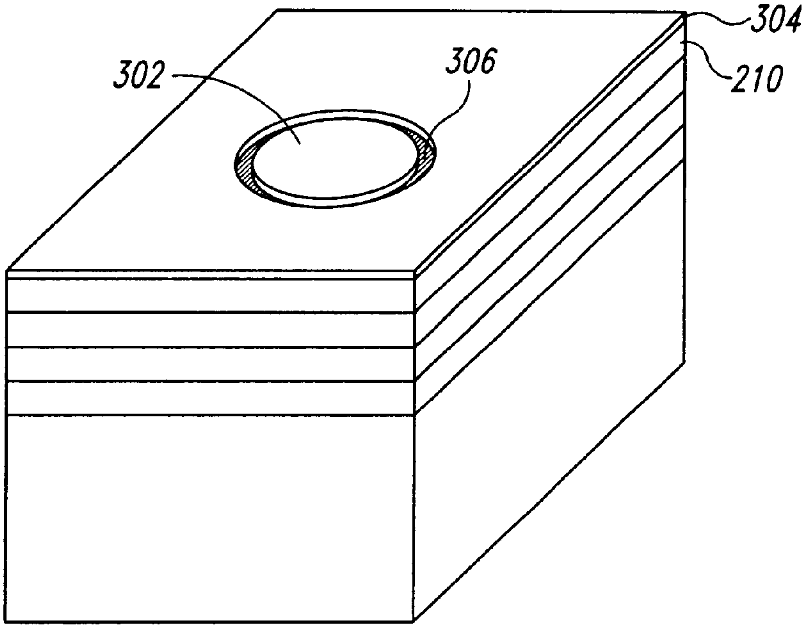
FIG. 3 shows the layered silicon substrate following photolithographic patterning and photoresist removal.

FIG. 2 shows a rectangular portion of an initial silicon substrate layered with dielectric and metallic layers. The silicon substrate 202 underlies a first dielectric layer 204, a first metallic layer 206, a second dielectric layer 208, and a second metallic layer 210. Various metals and metal alloys may be deposited to form metallic layers, including titanium and titanium nitride, using well-known microchip fabrication techniques. The dielectric layers are commonly $SiO_2$ layers deposited by low-pressure chemical vapor deposition ("LPCVD") techniques using tetraethyl orthosilicate ("TEOS"), $Si(OC_2H_5)_4$. In a first step, the layered silicon substrate is coated with a layer of photoresist, which is then patterned and selectively removed by well-known photolithographic techniques. FIG. 3 shows the layered silicon substrate following photolithographic patterning and photoresist removal. The photoresist is selectively removed to create an annular, donut-like groove 302 through the photoresist layer 304 to expose an annular ring 306 on the surface of the second metallic layer 210.

In a next step, a reactive ion etching ("RIE") system that combines plasma etching and ion-beam etching techniques is used to anisotropically etch a cylindrical slot through the dielectric and metallic layers above the silicon substrate. FIG. 4 shows the layered silicon substrate following the anisotropic RIE etching step. This etching step creates a tube-like cylindrical slot 402 perpendicular to the surface of the silicon substrate and extending through the four dielectric and metallic layers 204, 206, 208, and 210. The etching step leaves a column or stack 404 of layered dielectric and metallic composition standing on the underlying silicon substrate. Note that the stack may be rectangular in shape if a rectangular slot is patterned into the photoresist layer (304 in FIG. 3) in the photolithographic step.

In a next step, the layered silicon substrate is exposed to an isotropic etch medium such as a plasma etch medium using plasma gasses such as $Cl_2$, $CF_2Br$, or $HBr/NF_3$ or solution-based isotropic etch media. Under carefully controlled concentrations and exposure timing, this etching step creates an annular or angular U-shaped groove within the silicon substrate below the first dielectric layer (204 in FIG. 4). FIG. 5 shows the layered silicon substrate following this second isotropic etch step. Note that this step removes the silicon substrate below the column (404 in FIG. 4) created during the first RIE etch step, and the column is removed to leave a cylindrical well 504 through the dielectric and metallic layers 204, 206, 208, and 210. The annular or angular U-shaped groove 508 created by the second isotropic etch step creates a conical silicon field emitter tip 506 directly below the cylindrical aperture 504.

FIG. 6 shows a cross-sectional view of a portion of the layered silicon substrate following the second etching step. FIG. 6 thus shows in cross-section the silicon-based field emitter tip shown in FIG. 5. In a third, final isotropic etch step, a $SiO_2$ etching solution, such as hydrofluoric acid, is used to pull back the dielectric layers from the walls of the cylindrical well. FIG. 7 shows the layered silicon substrate following the third etch, or pull-back, step. The hydrofluoric acid, or other $SiO_2$ solution or etching medium, is used to remove $SiO_2$ from the inner surface the cylindrical well 702–705. By pulling back the $SiO_2$, the chance of deposition of conductive materials on the walls of the cylindrical well that may create electrical shorts between the metal layers is significantly decreased.

In a final, optional step, a thin metallic coating may be deposited on the surface of the conical, silicon-based field emitter tip using any of various well-known sputter deposition techniques. In the preferred embodiment, the final sputter metal coat will cover both the top metal layer and the emitter tip. FIG. 8 shows a silicon-based field emitter tip 802 following sputter deposition of a metal 804 onto the surface of the field emitter tip.

Figure 9:
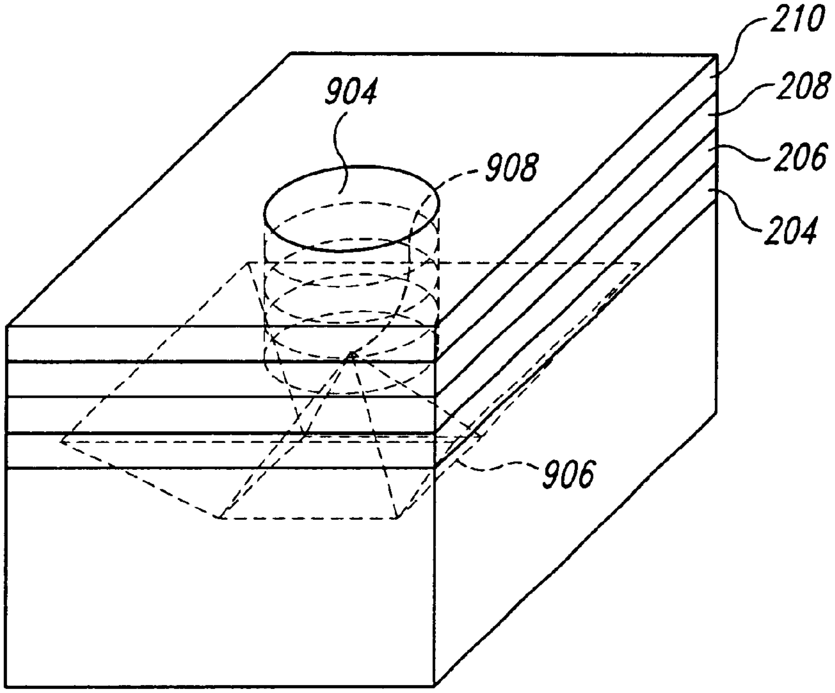
FIG. 9 shows the layered silicon substrate following a second isotropic etch step.
Figure 10:
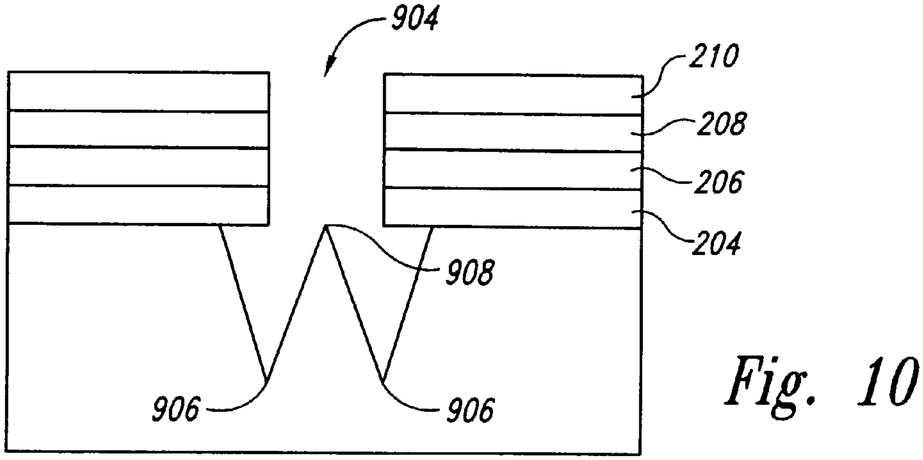
FIG. 10 shows a cross-sectional view of a portion of the layered silicon substrate following the second etching step described with reference to FIG. 9.
Figure 11:
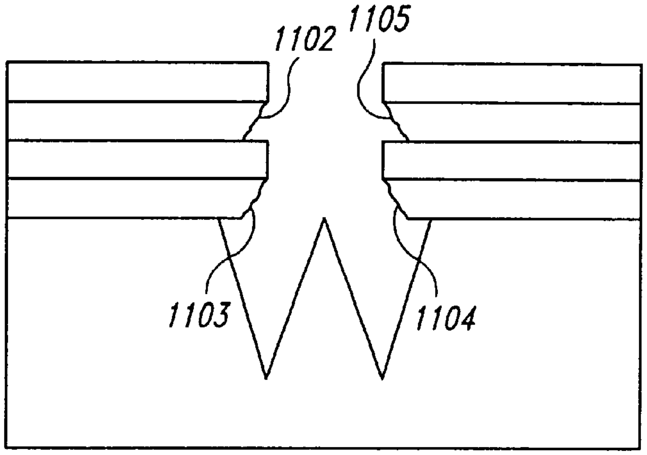
FIG. 11 shows the layered silicon substrate following a third etch, or pull back, step.
Figure 12:
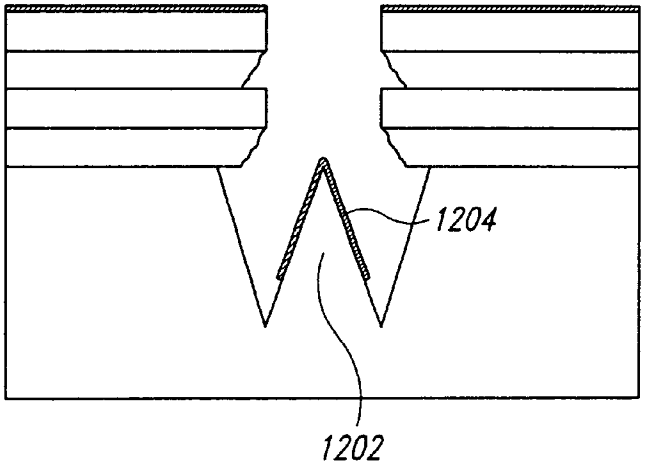
FIG. 12 shows a silicon-based field emitter tip following sputter deposition of a metal onto the surface of the field emitter tip.

A second embodiment begins with the layered silicon substrate following the anisotropic RIE etching step shown in FIG. 4. In a next step, the layered silicon substrate is exposed to an anisotropic etch solution such as tetramethyl ammonium hydroxide ("TMAH") or potassium hydroxide ("KOH"). Under carefully controlled concentrations and exposure timing, this etching step creates a rectangular V-shaped groove within the silicon substrate below the first dielectric layer (204 in FIG. 4). FIG. 9 shows the layered silicon substrate following a second anisotropic etch step. Note that this step removes the silicon substrate below the column (404 in FIG. 4) created during the first RIE etch step, and the column is thus removed to leave a cylindrical well 904 through the dielectric and metallic layers 204, 206, 208, and 210. The rectangular V-shaped groove 906 created by the second isotropic etch step creates a pyramid-shaped silicon field emitter tip 908 directly below the cylindrical aperture 904. FIG. 10 shows a cross-sectional view of a portion of the layered silicon substrate following the second etching step described with reference to FIG. 9. FIG. 10 thus shows in cross-section the silicon-based field emitter tip shown in FIG. 9. In a third, final isotropic etch step, a $SiO_2$ etching solution, such as hydrofluoric acid, is used to pull back the dielectric layers in the walls of the cylindrical well. FIG. 11 shows the layered silicon substrate following the third etch, or pull back, step. Hydrofluoric acid, or other $SiO_2$ solution or etching medium, is used to remove $SiO_2$ from the inner surface of cylindrical well 1102–1105. By pulling back the $SiO_2$, the chance of deposition of conductive materials in the walls of the cylindrical well that may create electrical shorts between the metal layers is significantly decreased. In a final, optional step, a thin metallic coating may be deposited on the surface of the pyramid-shaped, silicon-based field emitter tip using any of various well-known sputter deposition techniques. In a preferred embodiment, the final sputter metal coat covers both the top metal layer and the emitter tip itself. FIG. 12 shows a silicon-based field emitter tip 1202 following sputter deposition of a metal 1204 onto the surface of the field emitter tip.

Figure 13:
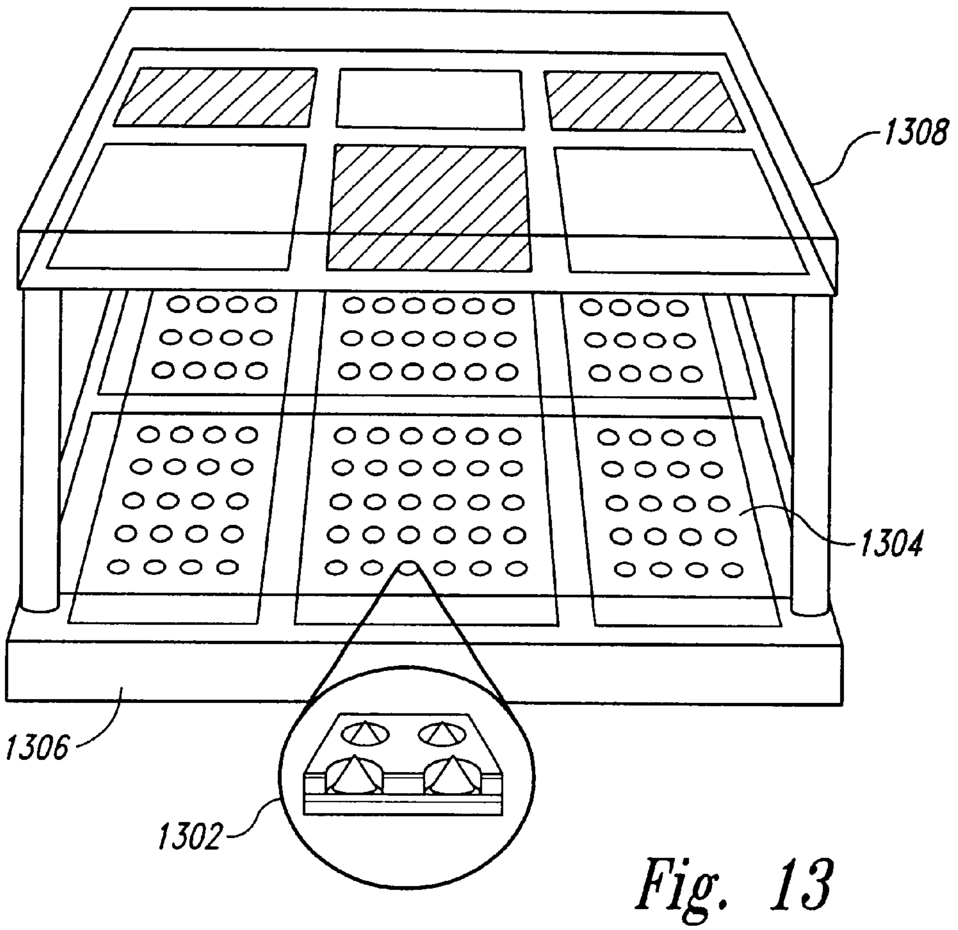
FIG. 13 illustrates a computer display device based on field emitter tip arrays.

Silicon-based field emitter tips can be micro-manufactured by microchip fabrication techniques as regular arrays, or grids, of field emitter tips. Uses for arrays of field emitter tips include computer display devices. FIG. 13 illustrates a computer display device based on field emitter tip arrays. Arrays of silicon-based field emitter tips 1302 are embedded into emitters 1304 arrayed on the surface of a cathode base plate 1306 and are controlled, by selective application of voltage, to emit electrons which are accelerated towards a face plate anode 1308 coated with chemical phosphors. When the emitted electrons impact onto the phosphor, light is produced. In such applications, the individual silicon-based field emitter tips have tip radii on the order of hundreds of Angstroms and emit currents of approximately 10 nanoamperes per tip under applied electrical field strengths of around 50 Volts.

Figure 14:
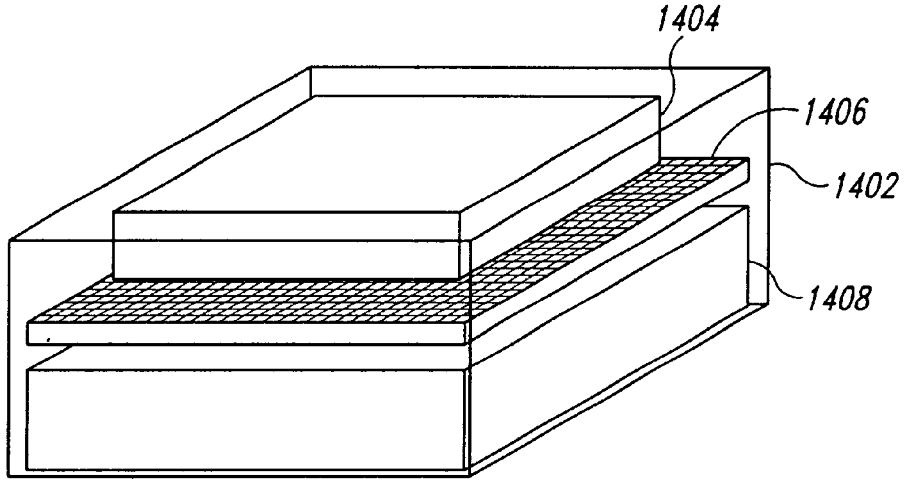
FIG. 14 illustrates an ultra-high density electromechanical memory based on a phase-change storage medium.

Silicon-based field emitter tips are also employed in various types of ultra-high density electronic data storage devices. FIG. 14 illustrates an ultra-high density electromechanical memory based on a phase-change storage medium. The ultra-high density electromechanical memory comprises an air-tight enclosure 1402 in which a silicon-based field emitter tip array 1404 is mounted, with the field emitter tips vertically oriented in FIG. 14, perpendicular to lower surface (obscured in FIG. 14) of the silicon-based field emitter tip array 1404. A phase-change storage medium 1406 is positioned below the field emitter tip array, movably mounted to a micromover 1408 which is electronically controlled by externally generated signals to precisely position the phase-change storage medium 1406 with respect to the field emitter tip array 1404. Small, regularly spaced regions of the surface of the phase-change storage medium 1406 represent binary bits of memory, with each of two different solid states, or phases, of the phase-change storage medium 1406 representing each of two different binary values. A relatively intense electron beam emitted from a field emitter tip can be used to briefly heat the area of the surface of the phase-change storage medium 1406 corresponding to a bit to melt the phase-change storage medium underlying the surface. The melted phase-change storage medium may be allowed to cool relatively slowly, by relatively gradually decreasing the intensity of the electron beam to form a crystalline phase, or may be quickly cooled, quenching the melted phase-change storage medium to produce an amorphous phase. The phase of a region of the surface of the phase-change storage medium can be electronically sensed by directing a relatively low intensity electron beam from the field emitter tip onto the region and measuring secondary electron emission or electron backscattering from the region, the degree of secondary electron emission or electron backscattering dependent on the phase of the phase-change storage medium within the region. A partial vacuum is maintained within the airtight enclosure 1402 so that gas molecules do not interfere with emitted electron beams.

Although the present invention has been described in terms of a particular embodiment, it is not intended that the invention be limited to this embodiment. Modifications within the spirit of the invention will be apparent to those skilled in the art. For example, as already pointed out, many different shapes and sizes of field emitter tips can be created using different photolithographic masks, different metal and dielectric deposition steps, and different etch steps. Different steps may involve altering the chemical composition of etching solutions, reactive ions or chemical etchants in the anisotropic etching step, and the time during which the layered silicon substrate is exposed to the etching solutions and etching media. The silicon substrate may already contain fabricated microelectronic circuits. Different semiconductor substrates, non-conductive layers, and conductive layers may be employed, depending on the desired physical and performance properties of the resulting field emitter tip.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method for microfabricating a field emitter tip, the method comprising:

providing a substrate layered with a first non-conductive layer, a first conductive layer, a second non-conductive layer, and a second conductive layer;

positioning a photoresist mask on the surface of the second conductive layer;

anisotropically etching a slot through the first non-conductive layer, the first conductive layer, the second non-conductive layer, and the second conductive layer to create a pillar below the photoresist mask resting on the substrate; and etching the substrate below the slot to remove the pillar and to create a central field emitter tip in the substrate below a well formed by removal of the pillar.

2. The method of claim 1 wherein the substrate is a silicon substrate, the non-conductive layers are dielectric layers, and the conductive layers are metal layers.

3. The method of claim 2 further including employing an isotropic etch to pull back the dielectric layers from the walls of the well.

4. The method of claim 2 further including sputtering a thin metal layer onto the surface of the central field emitter tip to form a metallized field emitter tip.

5. The method of claim 2 wherein positioning a photoresist mask on the surface of the second conductive layer further comprises:

depositing a layer of photoresist on the surface of the second metal layer;

photolithographically patterning the photoresist mask; and selectively removing photoresist to create a groove through the photoresist layer to bare a portion of the surface of the second metallic layer.

6. The method of claim 5 wherein anisotropically etching a slot through the first dielectric layer further comprises exposing the bared surface of the second metallic layer and underlying dielectric and metal layers to a reactive ion etching medium.

7. The method of claim 2 wherein etching the substrate below the slot to remove the pillar and to create a central field emitter tip in the substrate below a well formed by removal of the pillar comprises exposing the silicon beneath the slot to an isotropic etch medium.

8. The method of claim 7 wherein the isotropic etch medium is a plasma etch medium.

9. The method of claim 7 wherein the isotropic etch medium is a solution-based isotropic etch medium.

10. The method of claim 2 wherein etching the substrate below the slot to remove the pillar and to create a central field emitter tip in the substrate below a well formed by removal of the pillar comprises exposing the silicon beneath the slot to an anisotropic etch medium.

11. The method of claim 10 wherein the anisotropic etch medium is a tetramethyl ammonium hydroxide solution.

12. The method of claim 10 wherein the anisotropic etch medium is a potassium hydroxide solution.

13. The method of claim 2 wherein the metal layers comprise layers of titanium.

14. The method of claim 2 wherein the metal layers comprise layers of titanium nitride.

15. The method of claim 2 wherein the dielectric layers comprise layers of $SiO_2$.

16. The method of claim 2 further including applying the positioning a photoresist mask, anisotropically etching a slot, and etching the substrate steps over the surface of the provided layered substrate to produce an array of silicon-based field emitter tips.

17. A method for manufacturing an ultra-high density memory device, the method comprising:

providing a substrate layered with a first non-conductive layer, a first conductive layer, a second non-conductive layer, and a second conductive layer;

positioning a photoresist mask on the surface of the second conductive layer;

anisotropically etching slots through the first non-conductive layer, the first conductive layer, the second non-conductive layer, and the second conductive layer to create an array of pillars below the photoresist mask resting on the substrate;

etching the substrate below the slots to remove the pillars and to create an array of field emitter tips in the substrate below wells formed by removal of the pillars; and incorporating the array of field emitter tips as the electron source within the ultra-high density memory device.

18. A method for manufacturing a field emission display device, the method comprising:

providing a substrate layered with a first non-conductive layer, a first conductive layer, a second non-conductive layer, and a second conductive layer;

positioning a photoresist mask on the surface of the second conductive layer;

anisotropically etching slots through the first non-conductive layer, the first conductive layer, the second non-conductive layer, and the second conductive layer to create an array of pillars below the photoresist mask resting on the substrate;

etching the substrate below the slots to remove the pillars and to create an array of field emitter tips in the substrate below wells formed by removal of the pillars; and incorporating the array of field emitter tips as the electron source within the field emission display device.

* * * * *